United States Patent
Chen et al.

(10) Patent No.: US 12,451,432 B2
(45) Date of Patent: Oct. 21, 2025

(54) MULTI-LAYER TOPOLOGICAL INTERCONNECT WITH PROXIMAL DOPING LAYER

(71) Applicant: INTERNATIONAL BUSINESS MACHINES CORPORATION, Armonk, NY (US)

(72) Inventors: Ching-Tzu Chen, Ossining, NY (US); Christian Lavoie, Pleasantville, NY (US); Guy M. Cohen, Westchester, NY (US); Utkarsh Bajpai, Delmar, NY (US); Nicholas Anthony Lanzillo, Wynantskill, NY (US); Teodor Krassimirov Todorov, Yorktown Heights, NY (US); Oki Gunawan, Westwood, NJ (US); Nathan P. Marchack, New York, NY (US); Peter Kerns, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 89 days.

(21) Appl. No.: 17/956,334

(22) Filed: Sep. 29, 2022

(65) Prior Publication Data
US 2024/0113024 A1    Apr. 4, 2024

(51) Int. Cl.
*H01L 23/532* (2006.01)
*H01L 21/768* (2006.01)

(52) U.S. Cl.
CPC .. *H01L 23/53209* (2013.01); *H01L 21/76852* (2013.01); *H01L 21/76867* (2013.01);
(Continued)

(58) Field of Classification Search
CPC ......... H01L 21/76852; H01L 21/76867; H01L 21/76885; H01L 23/53223;
(Continued)

(56) References Cited

U.S. PATENT DOCUMENTS

| 5,283,948 A | 2/1994 | Schroeder et al. |
| 6,239,384 B1 | 5/2001 | Smith et al. |

(Continued)

FOREIGN PATENT DOCUMENTS

| CN | 105006485 A | 10/2015 |
| CN | 114361325 A | * 4/2022 |

(Continued)

OTHER PUBLICATIONS

[NPL-1] Ji et al. (CN 114361325 A); Apr. 15, 2022 (EPO—machine translation to English). (Year: 2022).*

(Continued)

*Primary Examiner* — Donald M Flores, Jr.
(74) *Attorney, Agent, or Firm* — Tutunjian & Bitetto, P.C.; L. Jeffrey Kelly

(57) ABSTRACT

An interconnect structure including conducting layers of topological semi-metals and/or topological insulators. To increase charge carrier density in the conducting layers, a charge carrier doping layer present on at least one surface of the one or more conductive layers of topological semi-metals. The charge carrying doping layers have a charge carrier density greater than the topological semi-metals and/or topological insulators of the one or more conductive layers.

9 Claims, 4 Drawing Sheets

(52) U.S. Cl.
CPC .. *H01L 21/76885* (2013.01); *H01L 23/53223* (2013.01); *H01L 23/53252* (2013.01); *H01L 23/53266* (2013.01); *H01L 23/5329* (2013.01); *Y10T 428/24479* (2015.01)

(58) Field of Classification Search
CPC ........... H01L 23/53252; H01L 23/5329; Y10T 428/24479
See application file for complete search history.

(56) References Cited

U.S. PATENT DOCUMENTS

| | | | |
|---|---|---|---|
| 9,362,227 | B2 | 6/2016 | Zhang et al. |
| 9,431,605 | B2 | 8/2016 | Sills et al. |
| 9,613,905 | B2* | 4/2017 | Yazdani ............ H01L 23/53209 |
| 9,716,063 | B1 | 7/2017 | Edelstein et al. |
| 10,177,092 | B2 | 1/2019 | Edelstein et al. |
| 2015/0028440 | A1 | 1/2015 | Liu et al. |
| 2019/0385950 | A1* | 12/2019 | Pauly .................. H01L 23/5283 |
| 2020/0083333 | A1 | 3/2020 | Yang et al. |
| 2022/0157733 | A1* | 5/2022 | Chen ................. H01L 21/76831 |
| 2023/0030586 | A1* | 2/2023 | Han ........................ C23C 16/30 |
| 2023/0326857 | A1* | 10/2023 | Lu ..................... H01L 23/53271 257/152 |

FOREIGN PATENT DOCUMENTS

| | | |
|---|---|---|
| TW | 201727699 A | 8/2017 |
| TW | 1836996 B | 3/2024 |
| WO | 2018146307 A1 | 8/2018 |

OTHER PUBLICATIONS

[NPL-2] "Charge Carrier Density"; Wikipedia—the free encyclopedia, Aug. 16, 2024, <https://en.wikipedia.org/wiki/Charge_carrier_density>. (Year: 2024).*
[NPL-3] Fujioka et al., "Alloying-induced enhancement of thermopower in the Dirac-semimetal system Cd3-xZnxAs2"; Aug. 24, 2021; <https://journals.aps.org/prmaterials/abstract/10.1103/PhysRevMaterials.5.094201>. (Year: 2021).*
[NPL-4] Marchenkov et al., "Electronic Structure and Transport Properties of Bi2Te3 and Bi2Se3 Single Crystals"; Micromachines 2023, 14, 1888; <https://www.researchgate.net/publication/374375114_Electronic_Structure_and_Transport_Properties_of_Bi2Te3_and_Bi2Se3_Single_Crystals>. (Year: 2023).*
Chen et al., "Topological Semimetals for Scaled Back-End-of-Line Interconnect Beyond Cu", In 2020 IEEE International Electron Devices Meeting (IEDM) Dec. 1, 20202, pp. 32-34.
Galeski et al., "Signatures of a magnetic-field-induced Lifshitz transition in the ultra-quantum limit of the topological semimetal ZrTe5", arXiv preprint arXiv:2204.11993, Apr. 2, 20225, pp. 1-18.
Office Action from TW112118620 dated Nov. 17, 2023 (6 pages).

* cited by examiner

MULTI-LAYER TOPOLOGICAL INTERCONNECT WITH PROXIMAL DOPING LAYER

BACKGROUND

The present disclosure relates to interconnects for transmitting electrical signal, and more particularly to methods of reducing resistivity in interconnects.

Interconnects are the wiring schemes in integrated circuits, which may be formed during back-end-of-line (BEOL) processing. Interconnects can distribute clock and other signals, provide power and ground for various electronic system components, and interconnect the transistors within the integrated circuit (IC) chip front-end-of-line (FEOL).

As interconnect dimensions continue to shrink, increases in line resistance degrade transistor device performance. Extendibility of copper (Cu) interconnects is questionable, because copper (Cu) requires thick barrier & adhesion layers, which reduces the copper (Cu) volume in the line and increasing resistance of the line.

Among the alternative candidate materials for back end of the line (BEOL) interconnects, topological semimetal niobium arsenide (NbAs) has shown a 300K resistivity as low as ~1 $\mu\Omega$-cm in the sub-micron scale, enabling potential >50% RC reductions at 5 nm node dimensions. More generally, owing to significant surface-state contributions to carrier transport, both the resistance-area (RA) product and grain-boundary resistivity in the broad class of topological semimetals decrease with reducing dimensions, which makes them promising candidates for beyond Cu interconnects However, despite the favorable resistance-area (RA) scaling, topological semimetals contain lower carrier densities compared to conventional copper (Cu).

SUMMARY

In some embodiments, to take advantage of topological semimetals as a material for interconnects, while overcoming the lower carrier densities inherent in topological semimetals, structures and methods are described herein that allow for doping the topological semimetals with regions of high carrier concentration materials. In some embodiments, the structures and methods provided herein place one or more carrier-doping layers in contact with the interconnect wiring layers composed of topological semimetals to boost surface-state carrier density and conductivity of the topological semimetal material. In some embodiments, multilayer interconnect are provided herein that include topological semi-metal or topological insulator wiring layer(s) and one or more carrier doping layers in contact with the topological materials. In some embodiments, the carrier doping layer(s) can be discontinuous patches. The structures and methods described herein can provide desirable resistance-area (RA) scaling in reduced dimensions, while simultaneously providing excess carrier concentrations and preserving mobility. In some examples, when compared to interconnect wiring layers composed of the same topological semi-metal, the doped topological semi-metal wiring layers can provide orders of magnitude improvement in conductivity.

In one embodiment, an interconnect structures is provided that includes one or more conducting layers comprised of topological semi-metals and charge carrier doping layers present on at least one surface of the one or more conductive layers of topological semi-metals, wherein the charge carrying doping layers have a charge carrier density greater than the topological semi-metals of the one or more conductive layers. This embodiment increases charge carriers in topological semi-metals.

In another embodiment, an interconnect structure is provided that includes one or more conducting layers comprised of topological insulator and charge carrier doping layers present on at least one surface of the one or more conductive layers of topological insulator, wherein the charge carrying doping layers have a charge carrier density greater than the topological insulator of the one or more conductive layers. This embodiment increases charge carriers in topological insulators.

In yet another embodiment, an interconnect structure is provided that includes one or more conducting layers comprised a conductive material selected from the group consisting of topological semi-metals, topological insulators and combinations thereof.

The interconnect structure may also include discontinuous islands of charge carrier dopants present on at least one surface of the one or more conductive layers of topological insulators, topological semi-metals, or combinations thereof. The discontinuous islands of charge carrying dopants have a charge carrier density greater than the topological insulator of the one or more conductive layers. The discontinuous islands can serve to better distribute charge carriers throughout the topological semi-metals or topological insulators.

In an even further embodiment, an interconnect structure is provided that includes one or more conducting layers comprised a conductive material selected from the group consisting of topological semi-metals, topological insulators and combinations thereof. The interconnect structure may also include a core of charge carrier dopants present on at least one surface of the one or more conductive layers of topological insulators or topological semi-metals. The core of charge carrying dopants have a charge carrier density greater than the topological insulator or topological semi-metal of the one or more conductive layers. The core and shell all for positioning carrier dopants through out the structure.

In one embodiment, a method of forming an interconnect is provided. Metal lines are patterned of a topological semi-metal or topological insulator. Charge carrier concentration in the metal lines of the topological semi-metal is increased by depositing a charge carrier dopant material on at least one surface of the metal lines.

DETAILED DESCRIPTION OF PREFERRED EMBODIMENTS

Figure 1:
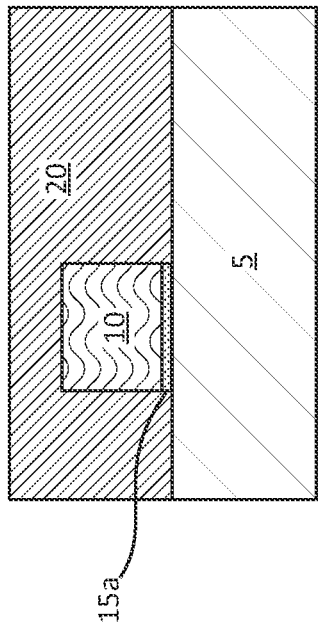
FIG. 1 is a side cross-sectional view of an interconnect composed of a first carrier doping layer at a base of the interconnect line composed of a topological semi-metal or topological insulator, and a second carrier doping layer at an upper surface of the interconnect line, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the structures and methods provided herein place one or more carrier-doping layers in contact with the interconnect wiring layers composed of topological semi-metals or topological insulators to boost surface-state carrier density and conductivity of the topological semi-metal material. In some embodiments, multilayer interconnect are provided herein that include topological semi-metal or topological insulator wiring layer(s) and one or more carrier doping layers in contact with the topological materials.

"Topological semi-metals" refer to a class of materials in which conduction and valence bands touch at discrete nodal points or along a loop in the first Brillouin zone near the Fermi energy. Such band-crossing points are robust in 3D materials with either broken inversion symmetry or broken time-reversal symmetry, namely, in 3D non-centrosymmetric or 3D magnetic materials. The band-crossing point locations may shift in the Brillouin zone, but they cannot be removed by small perturbations in material parameters. These band-crossing points are generally referred to as the Weyl nodes. One can define an integer-value topological invariant (called Chern number) for each Weyl node as the flux of its "Berry curvature," where Berry curvature is the momentum-space analogue of the magnetic field. The Weyl nodes thus correspond to the momentum-space magnetic monopoles, namely, the sources or sinks of the Berry curvature. Just as magnetic flux lines must form closed loops, Weyl nodes with opposite Chern numbers appear in pairs in the Brillouin zone.

Another defining attribute of the topological semi-metals is the presence of topological surface states connecting the two Weyl nodes in pairs, forming open Fermi arcs at the Fermi energy. The number of surface bands emanating from one Weyl node to the other is equal to the Chern number associated with the Weyl nodes. Again, small perturbations in structural or material parameters cannot remove the Fermi arcs unless pairs of Weyl nodes annihilate each other, which implies that the topology of the material band structure must change for this to happen. Therefore, both the Weyl nodes and the Fermi arcs are said to be topologically protected.

There are many types of topological semi-metals. We roughly categorize them according to the dimensionality of the band crossings and band degeneracies at the nodes.

Those with 0D band crossings include Weyl semi-metals and multifold-fermion semi-metals. The former has a 2-fold band degeneracy, while the latter can have 3-, 4-, 6-, or 8-fold band degeneracies at the nodes. The non-magnetic, non-centrosymmetric Weyl semi-metals include the TaAs, TaP, NbAs, NbP family, $(Mo,W)Te_2$, LaAlGe, and TaIrTe$_4$. The magnetic Weyl semi-metals include: $Co_3Sn_2S_2$, $Mn_{3+x}Sn_{1-x}$, $EuCd_2As_2$, RAlGe (where R is a rare earth metal), and PrAlGe. The multifold-fermion semi-metals include CoSi, RhSi, CoGe, RhGe, and AlPt. The double-Weyl fermion may also be used in some embodiments.

Weyl nodes and Fermi arcs also exist in non-magnetic chiral crystals with relevant spin-orbit coupling. Candidates of these so-called Kramers-Weyl fermion topological semi-metals include: $Ag_3BO_3$ (SG-156), $TlTe_2O_6$ (SG-150), $Ag_2Se$ (SG-19), etc., where SG=space group.

Topological semi-metals with 1D band crossings are called topological nodal-line semi-metals. These semi-metals include: $Co_2MnGa$, and $XY_4$ crystals (X=Ir, Ta, Re; Y=F, Cl, Br, I) with lattices formed of octahedra, similar to $IrF_4$.

Besides the topological semi-metals described above, there is yet another distinct type of topological conducting materials—the triple-point topological metals. They feature topologically protected Weyl nodes of three bands, two of which are degenerate along a high-symmetry direction in the Brillouin zone. They are distinct from the topological semi-metals in that the band gap between the conduction and the valence bands closes along this high-symmetry line. Examples of triple-point topological metals include WC, MoC, MoP, MoN, ZrTe, etc.

It is noted that the above compositions for the topological semi-metals is provided for illustrative purposes only. Although those compositions may be used for the topological semi-metals in the followings methods and structures that are described with reference to FIGS. 1-20, the present disclosure is not limited to only those examples.

Unlike topological insulators, topological semi-metals have a much higher carrier density at the Fermi level and also high carrier mobility, enabling high current-carrying capacity. As the dimension of the topological semi-metal scales below ~10 nm, carrier transport via the Fermi-arc states becomes pronounced, potentially dominating over the bulk-state transport. Depending on the types of impurity scattering and the type of topological semi-metals, significant surface-state transport may persist up to ~100 μm.

As noted above, in some embodiments, the interconnect wiring layers may be provided by a topological insulator. A "topological insulator" is a material that behaves as an insulator in its interior, but whose surface contains conducting states. This means that electrons can only move along the surface of the material. Topological insulators have non-trivial symmetry-protected topological order. What is special about topological insulators is that their surface states are symmetry-protected Dirac fermions by particle number conservation and time-reversal symmetry. In two-dimensional (2D) systems, this ordering is analogous to a conventional electron gas subject to a strong external magnetic field causing electronic excitation gap in the sample bulk and metallic conduction at the boundaries or surfaces. Topological insulators has been focused on bismuth and antimony chalcogenide based materials. Some examples of topological insulators include $Bi_2Se_3$, $Bi_2Te_3$, $Sb_2Te_3$, $(Bi_{(1-x)}Sb_x)_2Te_3$, $Bi_{1.1}Sb_{0.9}Te_2S$, $Bi_{1-x}Sb_x$ and combinations thereof.

It is noted that the above compositions for the topological semi-metals is provided for illustrative purposes only. Although those compositions may be used for the topological semi-metals in the followings methods and structures that are described with reference to FIGS. 1-20, the present disclosure is not limited to only those examples.

The interconnect structures of the present disclosure are now described with reference to FIGS. 1-9. In some embodiments, the structures provided herein place one or more carrier-doping layers in contact with the interconnect wiring layers composed of topological semimetals or topological insulators to boost surface-state carrier density and conductivity of the topological semimetal material. The carrier doping layers are metallic with high carrier density, and provide excess charge to the surface states of the topological interconnect layers. The structures and methods described herein can provide desirable resistance-area (RA) scaling in reduced dimensions, while simultaneously providing excess carrier concentrations and preserving mobility. In some examples, when compared to interconnect wiring layers composed of the same topological semi-metal, the doped topological semi-metal wiring layers can provide orders of magnitude improvement in conductivity.

FIG. 1 illustrates one embodiment of interconnect 100 that is present atop a substrate 5. The substrate 5 may be any substrate with pre-built devices/structures. For example, the substrate may be a type IV semiconductor substrate, such as a silicon (Si) substrate, in which the pre-built devices/structures can include field effect transistors, such as metal oxide semiconductor field effect transistors (MOSFETs), fin type field effect transistors (FinFETs), and vertical field effect transistors (VFET), as well as field effect transistors including nanosheets, etc.

The interconnect 100 may be atop the substrate 5, and can include an interconnect 10 line composed of a topological semi-metal or a topological insulator. Any of the aforementioned compositions for the topological semi-metal and/or the topological insulator may be employed for the interconnect line 10. The interconnect 100 may include a portion that is in electrical communication with the pre-built devices/structures of the substrate 5.

In some embodiments, the interconnect lines 10 have a thickness of 1 nm to 20 nm. Although FIGS. 1-9 illustrate interconnect lines 10, these wiring layers may also be patterned into vias.

Some embodiments of topological semi-metals and topological metals for the interconnect lines 10 that are depicted in FIGS. 1-9 can include (but are not limited to) Weyl semi-metals NbAs, TaAs, NbP, TaP, $(Mo,W)Te_2$ etc.; multi-fold fermion systems RhSi, CoSi etc., magnetic Weyl semi-metals $Co_3Sn_2S_2$, $Mn_{3+x}Sn_{1-x}$, PrAlGe etc.; Kramers-Weyl fermions $Ag_2Se$ etc., and triple-point topological metals MoP, WC, CoSn, etc. In one embodiment, the topological material wiring layer(s) can be: NbAs, NbP, TaAs, TaP, CoSi, CoGe, RhSi, RhGe, AlPt, MoP, $Bi_2Se_3$, MoP, WC, etc.

Some embodiments of topological insulators that are suitable for the interconnect lines 10 depicted in FIGS. 1-9 can include $Bi_2Se_3$, $Bi_2Te_3$, $Sb_2Te_3$, $Bi_{1.1}Sb_{0.9}Te_2S$, $Bi_{1-x}Sb_x$ and combinations thereof.

Still referring to FIGS. 1-9, in each of the depicted embodiments, carrier doping layers 15a, 15b, 15c, 15d, 15e, 15f, 15g, 15h, 15i may be present in contact with the interconnect lines 10. The carrier doping layers 15a, 15b, 15c, 15d, 15e, 15f, 15g, 15h, 15i are metallic with high carrier density, providing excess charge to the surface states of the topological interconnect lines 10. The composition of the carrier doping layers 15a, 15b, 15c, 15d, 15e, 15f, 15g, 15h, 15i is selected to provide that charge carriers be introduced to the topological material wiring layer(s), e.g., topological semi-metal and/or topological insulator for the interconnect lines 10. The charge carriers from the carrier doping layers 15a, 15b, 15c, 15d, 15e, 15f, 15g, 15h, 15i increase the charge carrier density in the interconnect lines 10. In some examples, the composition of the carrier doping layers 15a, 15b can be selected from NiSi, $TiSi_2$, Nb, Ta, TaN, $CoSi_2$, Rh, Ru, Ir, Pt etc.

In some embodiments, the carrier doping layers 15a, 15b, 15c, 15d, 15e, 15f, 15g, 15h, 15i may each comprise a 2-D monolayer (s). In some embodiments, the thickness of the carrier doping layers 15a, 15b, 15c, 15d, 15e, 15f, 15g, 15h, 15i ranges from 0.2 nm to 5 nm. The carrier doping layers 15a, 15b can act as an ion diffusion barrier and/or ambient encapsulant.

In some embodiments, the carrier doping layers 15a, 15b, 15c, 15d, 15e, 15f, 15g, 15h, 15i are composed of a material having a charger carrier density ranging from $1\times10^{22}$ carriers/$cm^3$ to $1\times10^{23}$ carriers/$cm^3$. In some embodiments, the carrier doping layers 15a, 15b, 15c, 15d, 15e, 15f, 15g, 15h, 15i are composed of a material having a low room-temperature resistivity on the order of 1-100 µΩ-cm.

In the embodiment depicted in FIG. 1, the interconnect lines 10 are in contact, e.g., in direct contact with, a first carrier doping layer 15a at a base of the interconnect line 10, and a second carrier doping layer 15b at an upper surface of the interconnect line 10. In the example, depicted in FIG. 1, carrier doping material, e.g., the first and second carrier doping layers 15a, 15b are not present on the sidewalls of the interconnect lines.

Figure 2:
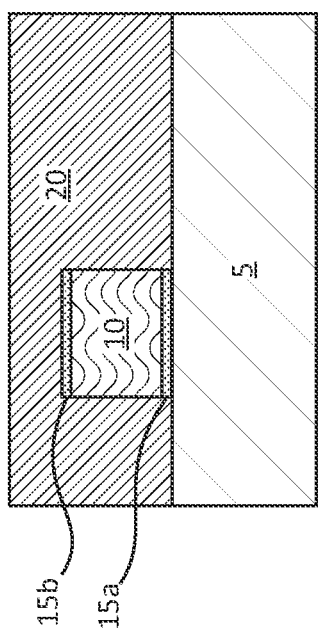
FIG. 2 is a side cross-sectional view of an interconnect composed of a first carrier doping layer at a base of the interconnect line composed of a topological semi-metal or topological insulator, in accordance with one embodiment of the present disclosure.

FIG. 2 illustrates another embodiment of the present disclosure. The example depicted in FIG. 2 is similar to the example depicted in FIG. 1. In the example, depicted in FIG. 2, the first carrier doping layer 15a is present at the base of the interconnect line 10, i.e., between the base of the interconnect line 10 and the substrate 5, but the second carrier doping layer 15b that is depicted in FIG. 1 is omitted. Although not illustrated other embodiments have been contemplated in which the first carrier doping layer 15a is omitted from the interface between the substrate 5 and the interconnect line 10, while the second carrier doping layer 15b is present at the upper surface of the interconnect line 10.

Figure 3:
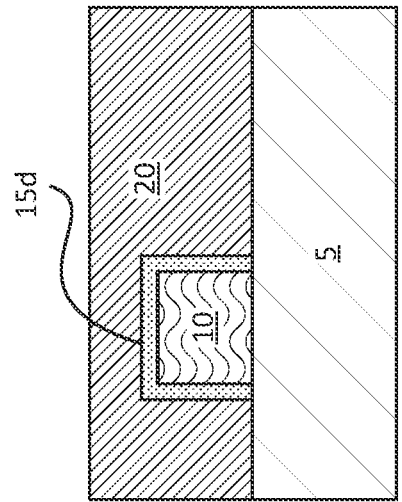
FIG. 3 is a side cross-sectional view of an interconnect having carrier doping layers present in multilayer extending through the interconnect line composed of a topological semi-metal or topological insulator, in accordance with one embodiment of the present disclosure.

FIG. 3 illustrates another embodiment of the present disclosure. FIG. 3 an interconnect line of multiple carrier doping layers 15c that are alternating with layers of electrically conductive material for the interconnect line 10. Similar to the embodiments illustrated in FIGS. 1 and 2, the layers of the interconnect line 10 may be composed of a topological semi-metal composition or a topological insulator, as described above. The carrier doping layers 15c that alternate with the composition layers of the interconnect line 10 may be selected from the group consisting of Nb, Ta, TaN, $CoSi_2$, Rh, Ru, Ir, Pt and combinations thereof. Similar to the examples depicted in FIGS. 1 and 2, in the embodiment depicted in FIG. 3, the multiple carrier doping layers 15c are not present on the sidewalls of the interconnect lines 10. Each of the multiple carrier doping layers 15c may a 2-D monolayer (s). Each of the multiple carrier doping layers 15c can have a thickness that ranges from 0.2 nm to 5 nm. Each of the multiple carrier doping layers 15c have a high carrier density, and provide excess charge to the surface states of the topological interconnect layers 10.

Figure 4:
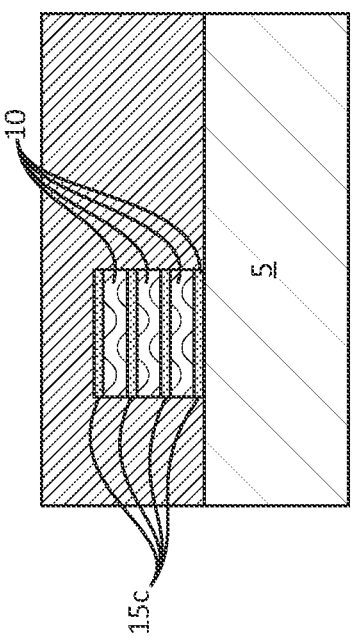
FIG. 4 is a side cross-sectional view of an interconnect having carrier doping layers present in an encapsulating layer around an interconnect line composed of a topological semi-metal or topological insulator, in accordance with one embodiment of the present disclosure.

FIG. 4 illustrates yet another embodiment of the present disclosure. In FIG. 4, the carrier doping layer 15d is present on the exterior sidewalls and upper surface of the interconnect line 10. The carrier doping layer 15d can be referred to as an encapsulant layer. The encapsulant layer may have a conformal thickness. In some embodiments, the thickness of the carrier doping layer 15d may range from 0.2 nm to 5 nm. The compositions for the first, second and alternating carrier doping layers 15a, 15b, 15c that are described above are equally applicable to the encapsulant layer carrier doping layer 15d that is depicted in FIG. 4. The encapsulant carrier doping layers 15d has a high carrier density, and provide excess charge to the surface states of the topological interconnect layers 10.

Figure 5:
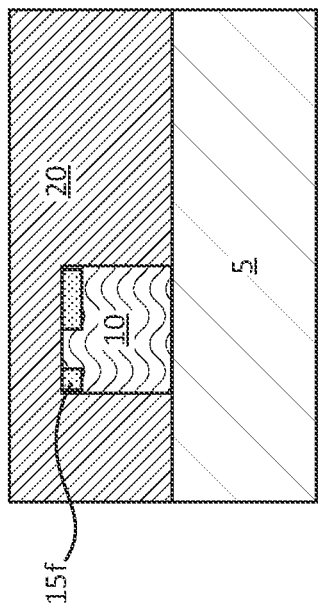
FIG. 5 is a side cross-sectional view of an interconnect composed of a first group of dopant islands at a base of the interconnect line composed of a topological semi-metal or topological insulator, and a second group of dopant islands at an upper surface of the interconnect line, in accordance with one embodiment of the present disclosure.
Figure 6:
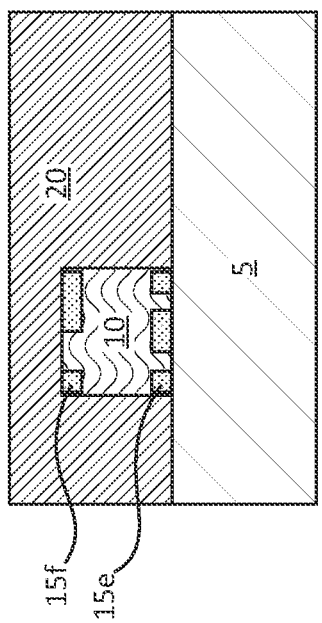
FIG. 6 is a side cross-sectional view of an interconnect composed of a first group of dopant islands at a base of the interconnect line composed of a topological semi-metal or topological insulator, in accordance with one embodiment of the present disclosure.

FIGS. 5 and 6 illustrate one embodiment of the present disclosure in which carrier dopants are introduced to the interconnect lines 10 by islands 15e, 15f of carrier dopants. The islands of carrier dopants are discontinuous patches of dopant material, as opposed to the continuous layers of the carrier doping layers having reference numbers 15a, 15b, 15c, 15d that extend across an entirety of a surface, such as an entirety of an upper surface of the interconnect lines 10, an entire height of sidewall surfaces of the interconnect lines 10, or entirety of the base surface of the interconnect lines 10. More specifically, the islands of carrier dopants are present on only a portion of a surface of the interconnect lines 10, such as a portion of the upper surface of the interconnect lines 10, a portion of the height of sidewall surfaces of the interconnect lines 10, or a portion of the base surface of the interconnect lines 10. In some examples, the islands may be provided by a dopant that is in the form of nanoparticles or quantum dots distributed on the surface(s) and/or bulk of the interconnect layer. The compositions for the first, second and alternating carrier doping layers 15a, 15b, 15c that are described above are equally applicable to the composition of the islands 15e, 15f of carrier dopants that are depicted in FIGS. 5 and 6. The islands of carrier dopants 15e, 15f have a high carrier density, and provide excess charge to the surface states of the topological interconnect layers 10.

Figure 7:
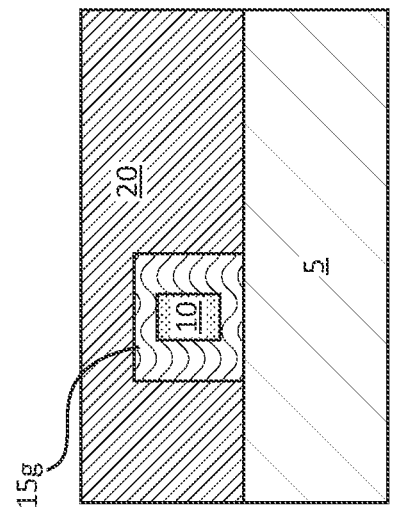
FIG. 7 is a side cross-sectional view of an interconnect having a core and shell arrangement, in which the core of the interconnect is provided by a topological semi-metal or topological insulator and the shell/cladding material is composed of a carrier dopant material, in accordance with one embodiment of the present disclosure.
Figure 8:
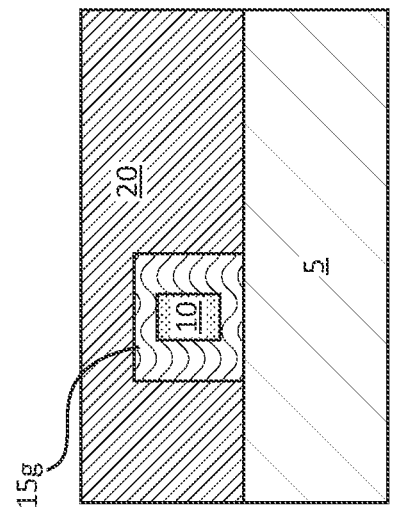
FIG. 8 is a side cross-sectional view of an interconnect having a core and shell arrangement, in which the core is composed of a carrier dopant material and the shell/cladding material is composed of a topological semi-metal or topological insulator, in accordance with one embodiment of the present disclosure.

FIGS. 7 and 8 illustrate some embodiments of the present disclosure in which core shell configurations are considered for the interconnect lines 10 and the carrier doping materials 15g, 15h. In FIG. 7, the core is provided by the interconnect lines 10, while the shell (also referred to as cladding) is composed of a carrier doping material 15g. In FIG. 8, the carrier doping material 15h provides the core of the structure, whereas the shell (also referred to as cladding) provides the interconnect lines 10. The compositions for the first, second and alternating carrier doping layers 15a, 15b, 15c that are described above are equally applicable to the composition of the carrier doping materials 15g, 15h that are illustrated in FIGS. 7 and 8. The carrier dopants 15g, 15h have a high carrier density, and provide excess charge to the surface states of the topological interconnect layers 10.

Figure 9:
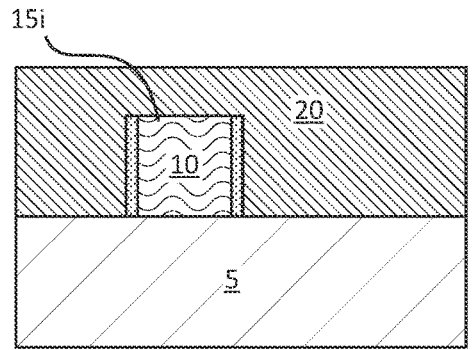
FIG. 9 is a side cross-sectional view of interconnect with interconnect lines composed of a topological semi-metal or topological insulator and having sidewalls of a carrier dopant layer, in accordance with one embodiment of the present disclosure.

In the embodiment depicted in FIG. 9, the interconnect lines 10 are in contact, e.g., in direct contact with, a sidewall carrier doping layer 15i on the sidewalls of the interconnect line 10. In the example, depicted in FIG. 1, carrier doping material, e.g., the sidewall carrier doping layer 15i, is not present on the upper surface of the interconnect lines 10. Similar to the embodiments described with reference to FIGS. 1-8, the interconnect lines 10 are composed of topological semi-metals or topological insulators. The compositions for the first, second and alternating carrier doping layers 15a, 15b, 15c that are described above are equally applicable to the composition of the sidewall carrier doping layer 15i that is illustrated in FIG. 9. The sidewall carrier doping layer 15i have a high carrier density, and provide excess charge to the surface states of the topological interconnect lines 10.

Each of the interconnect arrangement depicted in FIGS. 1-9 also include dielectric capping 20. The dielectric capping 20 may be provided by a nitride, such as silicon nitride, or oxide dielectric material.

FIGS. 10-15 illustrate one embodiment for forming an interconnect including interconnect lines 10 composed of at least one of topological semi-metals or topological insulators, in which charge carriers in the interconnect lines is increased by carrier doping materials.

Figure 10:
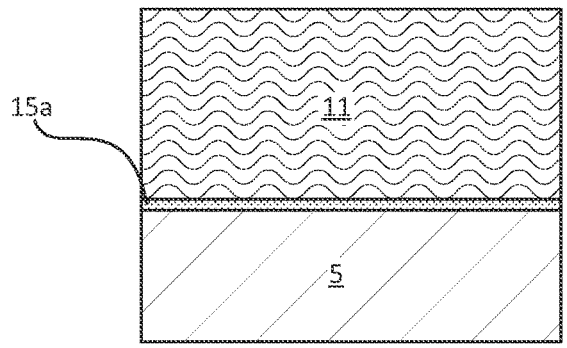
FIG. 10 is a side cross-sectional view illustrating an interconnect after the initial formation steps of forming a first carrier doping layer on top of a substrate (or dielectric) followed the formation of one of a topological material, e.g., topological semi-metal or topological insulator, on the first carrier doping layer, in accordance with one embodiment of the present disclosure.

In particular, FIG. 10 is a cross-sectional view depicting a topological interconnect 10 (comprising a set of vias) at an intermediate stage of the manufacturing process. In the embodiment depicted in FIG. 10, the substrate includes prebuilt devices that may have been processed to be in electrical communication with interconnect structures being processed in FIGS. 10-14. FIG. 10 shows the topological interconnect 10 after the initial formation of a first carrier doping layer 15a on top of a substrate 5 (or dielectric) followed the formation of one of a topological material 11, e.g., topological semi-metal or topological insulator, on the first carrier doping layer 15a.

The first carrier doping layer 15a may be composed of any carrier material that has been described herein. For example, the description of the compositions of the carrier doping material for the structures having reference numbers 15a, 15b, 15c, 15d, 15e, 15f, 15g, 15h and 15i are suitable for providing the composition of the first carrier doping layer 15a that is deposited atop the substrate 5. In some embodiments, the material of the first carrier doping layer 15a may be selected from the group consisting of Nb, Ta, TaN, $CoSi_2$, Rh, Ru, Ir, Pt and combinations thereof. In some examples, the first carrier doping layer 15a is selected to be a silicide, such as cobalt disilicide ($CoSi_2$). A number of deposition processes are suitable for forming the first carrier doping layer 15a. For example, the first carrier doping layer 15a may be formed by at least one of phase segregation, physical vapor deposition (PVD), chemical vapor deposition (CVD), atomic layer deposition (ALD), electro deposition, ion implantation, vapor phase reaction, liquid phase reaction, solid state reaction, or reaction with the substrate or liner material. In some embodiments, to provide monolayer thicknesses, atomic layer deposition (ALD) is selected. The thickness of the first carrier doping layer 15a may range from 0.2 nm to 5 nm.

It is noted that the first carrier doping layer 15a depicted in FIG. 10 may provide a carrier doping material between the topological material, e.g., topological semi-meal or topological insulator, for the interconnect line and the substrate, as illustrated in any of the embodiments depicted in FIGS. 1, 2 and 7, in which a continuous carrier doping layer at the base of the interconnect line is present. To provide a discontinuous doping material, such as the islands of doping material, as depicted in FIGS. 5 and 6, additional processing may be applied. In some embodiments, the islands of doping material can be provided by selective dry and wet etching applied to the deposited material layer of the first carrier doping layer 15a to provide either dry or wet etching across grain boundaries. For example, in one embodiment, in which the first carrier doping layer 15a is a silicide, such as cobalt disilicide, the carrier doping layer can be converted to discontinuous islands of carrier dopant material by a surface composition modification by reactive ion etch (RIE) along the grain boundaries. In some embodiments, discontinuous islands of carrier dopant material as illustrated by the structures identified by reference numbers 15f and 15e in FIGS. 5 and 6 can be provided by a wet etch. For example, when the carrier doping layer 15a is a silicide, such as cobalt silicide, the wet etch can selectively target cobalt (Co) to create silicon rich dopant areas near the surface (e.g., having a stoichiometry closer to $CoSi_2$). Alternatively, the wet etch can remove oxygen (O) content with a dilute hafnium fluoride (HF) composition.

Referring back to FIG. 10, the topological material 11 that is deposited on the first carrier doping layer 15a has a composition that is selected to provide the interconnect lines 10. For example, the topological material 11 may be any suitable topological semi-metal or topological insulator, as discussed herein. For example, the topological semi-metal may be NbAs. Additionally, forming the topological semi-metal 11 on the substrate 5 (or dielectric) may be done using any suitable fabrication process for depositing a semi-metal on a semiconductor or a dielectric. For example, blanket deposition techniques (e.g., PVD or CVD) may be used to deposit NbAs on the substrate 5. For completeness other deposition processes may be considered. For example, "deposition" is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Figure 11:
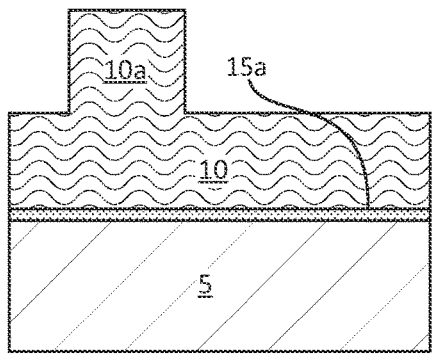
FIG. 11 is a side cross-sectional view illustrating subtractive line patterning performed to create one or more lines of topological semi-metal or topological insulator, in accordance with one embodiment of the present disclosure.

Referring now to FIG. 11, subtractive line patterning is performed to create one or more lines 10 of topological semi-metal 704 with gaps between them. The subtractive line 10 patterning may utilize any suitable fabrication process for removing part of the topological material 11. For example, etching may be used to remove portions of the topological material 11.

Additionally, via patterning is performed to create multiple vias 10a. Any suitable fabrication process for via patterning may be performed. For example, masks may be used during the etching process to prevent etching (or substantially etching) topological material where the vias 10a are to be formed.

Figure 12:
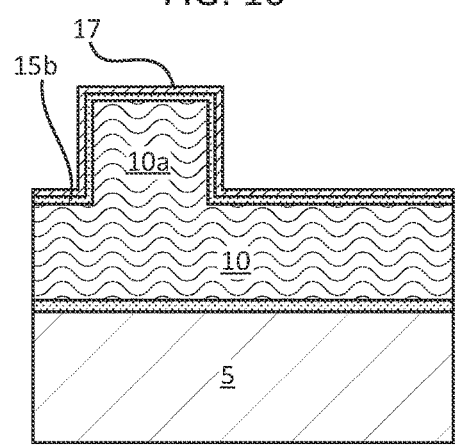
FIG. 12 is a side cross-sectional view of forming a second carrier doping layer on the interconnect lines and vias, and forming a protective layer 17 over the second carrier doping layer, in accordance with one embodiment of the present disclosure.

FIG. 12 illustrates one embodiment of forming a second carrier doping layer 15b on top surface of the interconnect lines 10 and vias 10a. In some embodiments, before the second carrier doping layer 15b is formed, oxidized portions of the topological material for the interconnect lines 10 and vias 10a can be removed. The oxidation can be removed by wet cleaning processes or etch processes. Following, the cleaning and/or etch processes to removed oxidation, the second carrier doping layer 15b is formed. The second carrier doping layer 15b may be composed of any carrier material that has been described herein. For example, the description of the compositions of the carrier doping material for the structures having reference numbers 15a, 15b, 15c, 15d, 15e, 15f, 15g, 15h and 15i are suitable for providing the composition of the second carrier doping layer 15b that is deposited atop the interconnect lines 10 and vias 10a. In some embodiments, the material of the second carrier doping layer 15b may be selected from the group consisting of Nb, Ta, TaN, $CoSi_2$, Rh, Ru, Ir, Pt and combinations thereof. In some examples, the first carrier doping layer 15a is selected to be a silicide, such as cobalt disilicide ($CoSi_2$). A number of deposition processes are suitable for forming the second carrier doping layer 15b. For example, the second carrier doping layer 15b may be formed by at least one of phase segregation, physical vapor deposition (PVD), chemical vapor deposition (CVD), atomic layer deposition (ALD), electro deposition, ion implantation, vapor phase reaction, liquid phase reaction, solid state reaction, or reaction with the substrate or liner material. In some embodiments, to provide monolayer thicknesses, atomic layer deposition (ALD) is selected. The thickness of the second carrier doping layer 15b may range from 0.2 nm to 5 nm.

It is noted that the second carrier doping layer 15b depicted in FIG. 12 may provide a carrier doping material on the upper surface of the topological material, e.g., topological semi-meal or topological insulator, as illustrated in any of the embodiments depicted in FIGS. 1, 3 and 7, in which a continuous carrier doping layer on the upper surface of the interconnect line 10 is present. To provide a discontinuous doping material, such as the islands of doping material, on the upper surface of the interconnect lines 10, as depicted in FIGS. 5 and 6, additional processing may be applied. In some embodiments, the islands of doping material can be provided by selective dry and wet etching applied to the deposited material layer of the second carrier doping layer 15b to provide either dry or wet etching across grain boundaries. For example, in one embodiment, in which the second carrier doping layer 15b is a silicide, such as cobalt disilicide, the carrier doping layer can be converted to discontinuous islands of carrier dopant material by a surface composition modification by reactive ion etch (RIE) along the grain boundaries. In some embodiments, discontinuous islands of carrier dopant material as illustrated by the structures identified by reference numbers 15f in FIG. 5 can be provided by a wet etch. For example, when the second carrier doping layer 15b is a silicide, such as cobalt disilicide, the wet etch can selectively target cobalt (Co) to create silicon rich dopant areas near the surface (e.g., having a stoichiometry closer to $CoSi_2$). Alternatively, the wet etch can remove oxygen (O) content with a dilute hafnium fluoride (HF) composition.

As illustrated by the different embodiments depicted in FIGS. 1-9, in the embodiments in which a carrier doping material is not present atop and upper surface of the via 10a and/or upper surface of the metal lines 10; the second carrier doping layer 15b may be omitted. In these embodiments, when the second carrier doping layer 15b is omitted, the subsequently described protective layer 15 may be formed directly atop the topological material, e.g., topological semi-metal and/or topological insulator, that provides the interconnect lines 10 and vias 10a.

It is further noted, that in some embodiments, the deposition sequence, as well as the order of the deposition sequence, for the materials that provide the topological material 11, e.g., the topological material for the topological semi-metal and the topological insulator, as well as the materials for the first and/or second carrier doping layer 15a, 15b may be repeated in process flows to provide the structures depicted in FIG. 3. The embodiment illustrated in FIG. 3 includes multiple carrier doping layers identified by reference number 15c.

Referring back to FIG. 12, following the formation of the second carrier doping layer 15b, a protective layer 17 is formed over the second carrier doping layer 15b that was formed on the tops and sides of the topological material that provides the interconnect lines 10 and vias 10a. In some embodiments (not shown), the protective layer 17 may also be formed on top of the substrate 5 between the interconnect lines 10.

The protective layer 17 may be any suitable layer that protects the topological semi-metal 704 from oxidation. For example, the protective layer 17 may be a dielectric, e.g., SiCN, SiN, SiC, or metal, such as a metal nitride, e.g., TaN, TiN or combinations thereof. The protective layer 17 may be formed on the second carrier doping layer 15b and the substrate 5 using any suitable fabrication process. For example, a proactive layer 17 may be formed using a deposition technique. Available deposition techniques may include physical vapor deposition (PVD), chemical vapor deposition (CVD), plasma enhanced chemical vapor deposition (PECVD), electrochemical deposition (ECD), molecular beam epitaxy (MBE) and more recently, atomic layer deposition (ALD) among others.

The protective layer 17 may only be deposited on top of the interconnect lines 10 and vias 10a. Additionally, the protective layer 17 may be deposited on the sides of the vias 10a.

Figure 13:
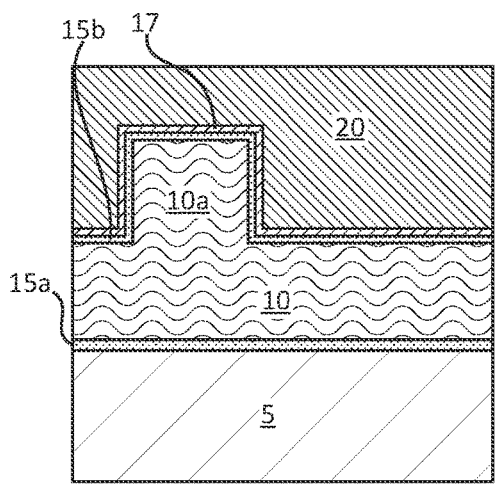
FIG. 13 is a side cross-sectional view illustrating one embodiment of forming a dielectric layer atop the structure depicted in FIG. 12.

Referring now to FIG. 13, a dielectric layer 20 is formed on top of the protective layer 17. The dielectric layer 20 may be formed using any suitable dielectric material and fabrication technique. The dielectric layer 20 may have a composition selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). The dielectric layer 20 can fill in the gaps between the interconnect lines 10 and vias 10a. Additionally, the dielectric layer 20 is formed on top of the vias 10a.

Figure 14:
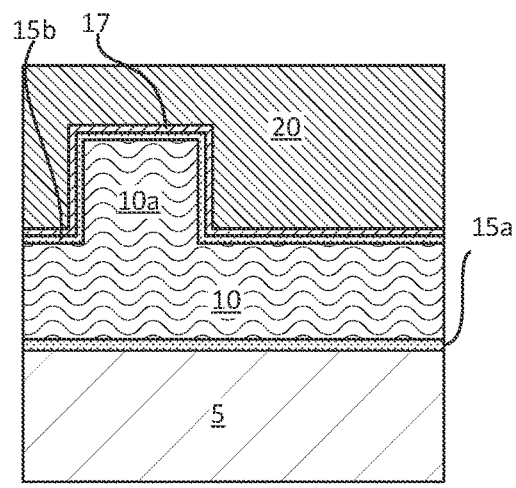
FIG. 14 is a side cross-sectional view illustrating planarizing the structure depicted in FIG. 13, in accordance with one embodiment of the present disclosure.
Figure 15:
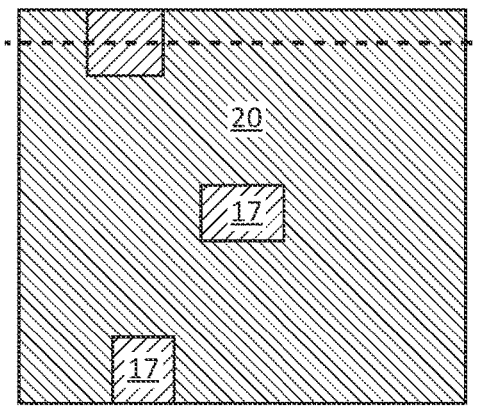
FIG. 15 is a top down view of the structure depicted in FIG. 14.

Referring now to FIGS. 14, the dielectric layer 20 undergoes a polishing process (e.g., a dielectric CMP process). The dielectric layer 20 may be removed such that it fills the gaps between the vias 10a. For example, as shown in FIGS. 14 and 15, the dielectric layer 20 is removed such that the top parts of the dielectric layer 20 is flush with the highest parts of the protective layer 17 (i.e., the parts that are on top of the vias 10a). This results in the protective layer 17 on top of the vias 10a being exposed.

Although not depicted in the supplied figures, a dielectric cap is formed on top of the exposed parts of the protective layer 17 and the dielectric layer 20. The dielectric cap may be formed using any suitable fabrication process. For example, forming the dielectric cap may include depositing a dielectric (e.g., low-k) material on top of the protective layer 17 and the dielectric layer 20.

FIGS. 16-20 illustrate some embodiments of forming carrier dopant material layers on sidewalls of interconnect lines 10 and vias 10a, such as in the structure depicted in FIG. 9. The methods illustrated in FIGS. 16-20 may be combined with the methods illustrated in FIGS. 10-15 to provide carrier dopant material on base surfaces of interconnect structures, sidewall surfaces of interconnect structures and upper surfaces of interconnect structures, as desired.

Figure 16:
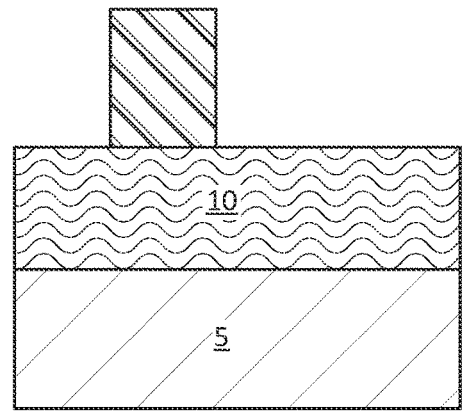
FIG. 16 is a side cross-sectional view illustrating forming a mask atop a topological material, in accordance with one embodiment of the present disclosure.

FIG. 16 illustrates one embodiment of forming a mask atop a topological material 11. The topological material 10 may be a topological semi-metal or a topological insulator, as described above with reference to FIGS. 1-15. Similarly, the topological material 10 may be atop a substrate 5. The mask 18 structure may be a photoresist mask that is patterned using photolithography and development processes.

Figure 17:
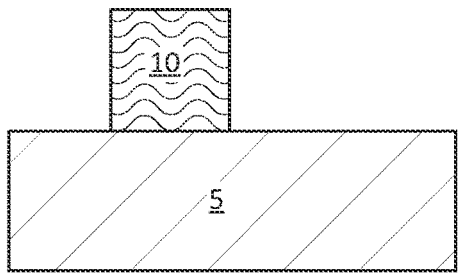
FIG. 17 is a side cross-sectional view illustrating etching the topological material using the mask depicted in FIG. 16 to pattern the structure, in accordance with one embodiment of the present disclosure.

FIG. 17 illustrates etching the topological material 10 using the mask 18 depicted in FIG. 16 to pattern the structure. In the embodiment, depicted in FIG. 17, the pattern provides an interconnect line 10. However, other geometries and structures may also be patterned.

Figure 18:
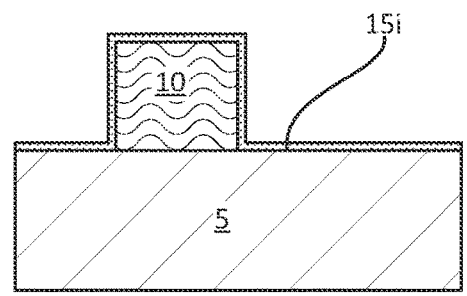
FIG. 18 is a side cross-sectional view of blanket depositing a carrier dopant layer on the structure depicted in FIG. 17 including the patterned topological material, in accordance with one embodiment of the present disclosure.

FIG. 18 depicts blanket depositing a carrier dopant layer 15i on the structure depicted in FIG. 17 including the patterned topological material, e.g., interconnect line 10. The carrier dopant layer 15i is deposited using a conformal deposition method, such as plasma enhanced chemical vapor deposition.

Figure 19:
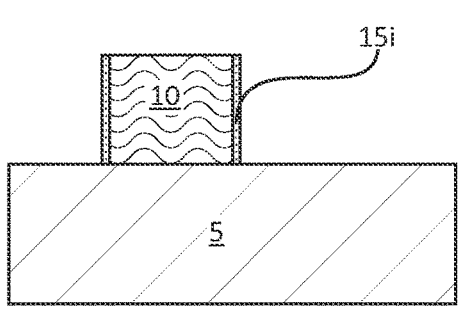
FIG. 19 is a side cross-sectional view of etching the blanket deposited carrier dopant layer that is depicted in FIG. 18 with an anisotropic etch that removed the horizontally orientated portions of the carrier dopant layer, while the vertically orientated portions of the carrier dopant layer remain on sidewalls of the interconnect structure.

FIG. 19 is a side cross-sectional view of etching the blanket deposited carrier dopant layer that is depicted in FIG. 18 with an anisotropic etch that removed the horizontally orientated portions of the carrier dopant layer 15i, while the vertically orientated portions of the carrier dopant layer 15i remain on sidewalls of the interconnect structure 10. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present invention include ion beam etching, plasma etching or laser ablation.

Figure 20:
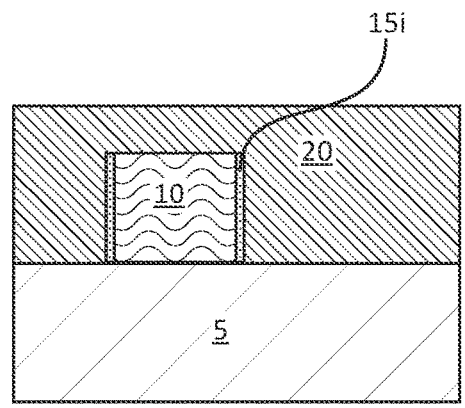
FIG. 20 is a side cross-sectional view illustrating depositing a dielectric on the structure depicted in FIG. 19, in accordance with one embodiment of the present disclosure.

FIG. 20 illustrating depositing a dielectric 20 on the structure depicted in FIG. 19. The dielectric 20 depicted in FIG. 20 is similar to the dielectric layers described in other embodiments of the present disclosure that also have reference number 20.

The embodiments of the disclosure that include core/shell arrangements, which are also referred to core and cladding arrangements, can be formed using deposition and etch processes similar to the other embodiments described herein. In one example, the material for the cladding or shell may first be deposited to provide the base shell/cladding portion. A material layer for the core may then be deposited atop the base shell/cladding portion. The material layer for the core can then be patterned to provide the appropriate dimensions to be positioned substantially centrally in the core/shell or core/cladding arrangement. Thereafter, a second material layer for the sidewall and upper surfaces of the cladding or shell be deposited encapsulating the core material between the base portion of the shell/cladding and the sidewall and upper surface portions of the shell/cladding. In some embodiments, such as those described with reference to FIG. 7, the core may be provided by a topological material, e.g., topological semi-metal or topological insulator, and the cladding/shell may be provided by a carrier doping layer 15g. In embodiments, such as those described with reference to FIG. 8, the core may be provided by the carrier doping material 15h, and the cladding/shell may be provided by a topological material, e.g., topological semi-metal or topological insulator.

Having described preferred embodiments of a multi-layer topological interconnect with proximal doping layer, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An interconnect structure comprising:
a plurality of conducting layers comprised of topological insulator selected from the group consisting of $Bi_2Se_3$, $(Bi_{(1-x)}Sb_x)_2Te_3$, $Bi_{1.1}Sb_{0.9}Te_2S$, and combinations thereof; and
a charge carrier doping layer present directly between the plurality of conducting layers of topological insulator, wherein the charge carrier doping layer has a charge carrier density greater than the topological insulator of the plurality of conducting layers.

2. The interconnect structure of claim 1, wherein the charge carrier doping layer has a composition selected from the group consisting of NiSi, $TiSi_2$, Nb, Ta, TaN, $CoSi_2$, Rh, Ru, Ir, Pt and combinations thereof.

3. An interconnect structure comprising:
at least one conducting layer comprising a conductive material selected from the group consisting of topological semi-metals, topological insulator and combinations thereof; and
discontinuous islands of charge carrier dopant materials present as patches on only a portion of at least one surface of the at least one conducting layer, wherein the discontinuous islands of charge carrier dopant materials have a charge carrier density greater than the conductive material of at least one conducting layer, and follow grain boundaries of the charge carrier dopant materials.

4. The interconnect structure of claim 3, wherein the conductive material is selected from the group consisting of $Bi_2Se_3$, $Bi_2Te_3$, $Sb_2Te_3$, $(Bi_{(1-x)}Sb_x)_2Te_3$, $Bi_{1.1}Sb_{0.9}Te_2S$, $Bi_{1-x}Sb_x$ and combinations thereof.

5. The interconnect structure of claim 3, wherein the discontinuous islands of charge carrier dopant materials have a composition selected from the group consisting of NiSi, $TiSi_2$, Nb, Ta, TaN, CoSi2, Rh, Ru, Ir, Pt and combinations thereof.

6. The interconnect structure of claim 3, wherein the conductive material is selected from the group consisting of TaAs, TaP, NbAs, NbP, $(Mo, W)Te_2$, LaAlGe, $TaIrTe_4$, $Co_3Sn_2S_2$, $Mn_{3+x}Sn_{1-x}$, $EuCd_2As_2$, RAlGe where R is a rare earth metal, PrAlGe, CoSi, RhSi, CoGe, RhGe, AlPt, MoP, WC, CoSn, and combinations thereof.

7. The interconnect structure of claim 3, wherein the discontinuous islands of charge carrier dopant materials are on a top surface and a bottom surface of each of the at least one conducting layers.

8. An interconnect structure comprising:
at least one conducting layer comprised of a core of a conductive material selected from the group consisting of $Bi_2Se_3$, $Bi_2Te_3$, $Sb_2Te_3$, $(Bi_{(1-x)}Sb_x)_2Te_3$, $Bi_{1.1}Sb_{0.9}Te_2S$, $Bi_{1-x}Sb_x$ and combinations thereof, and a cladding layer of charge carrier dopants completely surrounding the conductive core, wherein the cladding layer of charge carrier dopants have a charge carrier density greater than the conductive material of the at least one conducting layer.

9. The interconnect structure of claim 8, wherein the cladding layer of charge carrier dopants has a composition selected from the group consisting of NiSi, $TiSi_2$, Nb, Ta, TaN, $CoSi_2$, Rh, Ru, Ir, Pt and combinations thereof.

* * * * *